US010670008B2

(12) United States Patent
Kusumba et al.

(10) Patent No.: US 10,670,008 B2
(45) Date of Patent: Jun. 2, 2020

(54) METHOD FOR DETECTING HEAD CRASHING IN A LINEAR COMPRESSOR

(71) Applicants: Haier US Appliance Solutions, Inc., Wilmington, DE (US); University of Louisville Research Foundation, Inc., Louisville, KY (US)

(72) Inventors: Srujan Kusumba, Louisville, KY (US); Gregory William Hahn, Louisville, KY (US); Michael Lee McIntyre, Louisville, KY (US); Joseph W. Latham, Louisville, KY (US)

(73) Assignees: Haier US Appliance Solutions, Inc., Wilmington, DE (US); University of Louisville Research Foundation, Inc., Louisville, KY (US)

( * ) Notice: Subject to any disclaimer, the term of this patent is extended or adjusted under 35 U.S.C. 154(b) by 316 days.

(21) Appl. No.: 15/691,844

(22) Filed: Aug. 31, 2017

(65) Prior Publication Data

US 2019/0063424 A1 Feb. 28, 2019

(51) Int. Cl.
*F04B 49/06* (2006.01)
*F04B 35/04* (2006.01)
(Continued)

(52) U.S. Cl.
CPC .............. *F04B 49/06* (2013.01); *F04B 35/04* (2013.01); *F04B 35/045* (2013.01); *F04B 49/10* (2013.01);
(Continued)

(58) Field of Classification Search
CPC ...... F04B 35/045; F04B 49/06; F04B 49/065; F04B 2201/0201; F04B 2203/0401;
(Continued)

(56) References Cited

U.S. PATENT DOCUMENTS 3,782,859 A   1/1974 Schuman
4,291,258 A   9/1981 Clark et al.
(Continued)

FOREIGN PATENT DOCUMENTS

EP   0620367       4/1993
EP   2686554 A2   1/2014
(Continued)

OTHER PUBLICATIONS

Beck, Wesley, Pump Handbook (2007) McGraw-Hill, 4th Edition, Chapter 16 Pump Testing (Year: 2007), pp. 16.1-16.42.
(Continued)

*Primary Examiner* — Philip E Stimpert
(74) *Attorney, Agent, or Firm* — Dority & Manning, P.A.

(57) ABSTRACT

A method for detecting head crashing in a linear compressor includes sampling a rolling average of a peak applied voltage and a desired peak current each time that a current controller adjusts the desired peak current. The method also includes calculating a linear regression for a predicted peak applied voltage as a function of the desired peak current, calculating the predicted peak voltage for the motor of the linear compressor with the linear regression and a current value for the desired peak current from the current controller, and establishing that a piston of the linear compressor is soft crashing when the predicted peak voltage is different than the current value for the rolling average of the peak applied voltage by more than a threshold value.

25 Claims, 8 Drawing Sheets

(51) Int. Cl.
| | | |
|---|---|---|
| *F04B 49/12* | (2006.01) | |
| *F04B 49/10* | (2006.01) | |
| *F04B 51/00* | (2006.01) | |
| *G01R 19/00* | (2006.01) | |
| *G01R 31/34* | (2020.01) | |
| *G01R 19/04* | (2006.01) | |

(52) U.S. Cl.
CPC .............. *F04B 49/12* (2013.01); *F04B 51/00* (2013.01); *G01R 19/003* (2013.01); *G01R 19/04* (2013.01); *G01R 31/343* (2013.01); *F04B 2201/0201* (2013.01); *F04B 2203/0401* (2013.01); *F04B 2203/0402* (2013.01)

(58) Field of Classification Search
CPC . F04B 2203/0402; H02P 6/006; G01R 19/04; G01R 19/003
USPC ...... 417/44.11; 318/127, 128, 135, 432, 434; 700/280, 275, 282
See application file for complete search history.

(56) References Cited

U.S. PATENT DOCUMENTS

| | | | |
|---|---|---|---|
| 4,353,220 A | 10/1982 | Curwen et al. | |
| 4,538,964 A | 9/1985 | Brown | |
| 5,146,124 A | 9/1992 | Higham et al. | |
| 5,342,176 A | 8/1994 | Redlich | |
| 5,381,092 A | 1/1995 | Freedman | |
| 5,496,153 A | 3/1996 | Redlich | |
| 5,525,845 A | 6/1996 | Beale et al. | |
| 5,598,076 A | 1/1997 | Neubauer et al. | |
| 5,818,131 A | 10/1998 | Zhang | |
| 5,944,302 A | 8/1999 | Loc et al. | |
| 5,980,211 A | 11/1999 | Tojo et al. | |
| 6,231,310 B1 | 5/2001 | Tojo et al. | |
| 6,247,900 B1 | 6/2001 | Archibald et al. | |
| 6,289,680 B1 | 9/2001 | Oh et al. | |
| 6,753,665 B2 | 6/2004 | Ueda et al. | |
| 6,811,380 B2 | 11/2004 | Kim | |
| 6,812,597 B2 | 11/2004 | McGill et al. | |
| 6,883,333 B2 | 4/2005 | Shearer et al. | |
| 6,946,754 B2 | 9/2005 | Inagaki et al. | |
| 6,960,893 B2 | 11/2005 | Yoshida et al. | |
| 7,020,595 B1 | 3/2006 | Adibhatla et al. | |
| 7,187,152 B1 | 3/2007 | Tsai | |
| 7,439,692 B2 | 10/2008 | Lee | |
| 7,453,229 B2 | 11/2008 | Lee et al. | |
| 7,456,592 B2 | 11/2008 | Yoo et al. | |
| 7,497,146 B2 | 3/2009 | Clausin | |
| 7,550,941 B2 | 6/2009 | Dainez et al. | |
| 7,614,856 B2 | 11/2009 | Inagaki et al. | |
| 7,618,243 B2 | 11/2009 | Tian et al. | |
| 7,628,591 B2 | 12/2009 | Yoo et al. | |
| 7,663,275 B2 | 2/2010 | McGill | |
| 8,011,183 B2 | 9/2011 | Berchowitz | |
| 8,127,560 B2 | 3/2012 | Dicken et al. | |
| 8,177,523 B2 | 5/2012 | Patel et al. | |
| 8,241,015 B2 | 8/2012 | Lillie et al. | |
| 8,749,112 B2 | 6/2014 | Buquet et al. | |
| 8,784,069 B2 | 7/2014 | Lilie et al. | |
| 9,470,223 B2 | 10/2016 | Mallampalli et al. | |
| 9,518,578 B2 | 12/2016 | Dainez et al. | |
| 9,890,778 B2 | 2/2018 | Kusumba et al. | |
| 9,970,426 B2 | 5/2018 | Kim et al. | |
| 2001/0005320 A1 | 6/2001 | Ueda et al. | |
| 2002/0093327 A1 | 7/2002 | Yoo et al. | |
| 2002/0150477 A1 | 10/2002 | Hwang et al. | |
| 2003/0026703 A1 | 2/2003 | Yoo et al. | |
| 2003/0044286 A1 | 3/2003 | Kim | |
| 2003/0099550 A1* | 5/2003 | Kim ..................... F04B 35/045 417/44.11 | |
| 2003/0108430 A1 | 6/2003 | Yoshida et al. | |
| 2003/0147759 A1 | 8/2003 | Chang | |
| 2003/0161734 A1 | 8/2003 | Kim | |
| 2003/0177773 A1 | 9/2003 | Kim | |
| 2003/0201745 A1 | 10/2003 | Hayashi | |
| 2004/0005222 A1 | 1/2004 | Yoshida et al. | |
| 2004/0066163 A1 | 4/2004 | Yoo et al. | |
| 2004/0067140 A1 | 4/2004 | Yoo et al. | |
| 2004/0071556 A1 | 4/2004 | Sung et al. | |
| 2004/0108824 A1 | 6/2004 | Ueda et al. | |
| 2004/0119434 A1 | 6/2004 | Dadd | |
| 2004/0169480 A1 | 9/2004 | Ueda et al. | |
| 2004/0189103 A1 | 9/2004 | Duncan et al. | |
| 2004/0236494 A1 | 11/2004 | DeBotton et al. | |
| 2005/0031470 A1 | 2/2005 | Lee | |
| 2005/0083196 A1 | 4/2005 | Furem et al. | |
| 2005/0111987 A1 | 5/2005 | Yoo et al. | |
| 2005/0137722 A1 | 6/2005 | Yoo et al. | |
| 2005/0141998 A1 | 6/2005 | Yoo et al. | |
| 2005/0168179 A1 | 8/2005 | McGill et al. | |
| 2006/0070518 A1 | 4/2006 | McGill et al. | |
| 2006/0110259 A1 | 5/2006 | Puff et al. | |
| 2006/0171814 A1 | 8/2006 | Dainez et al. | |
| 2006/0171822 A1 | 8/2006 | Seagar et al. | |
| 2006/0228221 A1 | 10/2006 | Heo | |
| 2006/0228224 A1 | 10/2006 | Hong et al. | |
| 2006/0251524 A1 | 11/2006 | Yoo et al. | |
| 2006/0257264 A1 | 11/2006 | Kim et al. | |
| 2007/0095073 A1 | 5/2007 | Tian et al. | |
| 2007/0159128 A1 | 7/2007 | Dainez et al. | |
| 2007/0196214 A1 | 8/2007 | Bocchiola | |
| 2007/0241697 A1* | 10/2007 | Sung ..................... F04B 35/045 318/135 | |
| 2007/0241698 A1 | 10/2007 | Sung et al. | |
| 2007/0276544 A1 | 11/2007 | Dainez et al. | |
| 2008/0294098 A1 | 11/2008 | Sarkinen et al. | |
| 2009/0004026 A1 | 1/2009 | Yoo et al. | |
| 2009/0010766 A1 | 1/2009 | Yoo et al. | |
| 2009/0039655 A1 | 2/2009 | Berchowitz | |
| 2009/0047138 A1 | 2/2009 | Yoo et al. | |
| 2009/0094977 A1 | 4/2009 | Hill | |
| 2009/0097987 A1 | 4/2009 | Sung et al. | |
| 2009/0263262 A1 | 10/2009 | McGill | |
| 2010/0047079 A1 | 2/2010 | Reinschke | |
| 2011/0056196 A1 | 3/2011 | Berchowitz et al. | |
| 2011/0056235 A1 | 3/2011 | Hoshino et al. | |
| 2011/0058960 A1 | 3/2011 | Bernhard Lilie et al. | |
| 2011/0103973 A1 | 5/2011 | Dainez et al. | |
| 2012/0177513 A1 | 7/2012 | Lilie et al. | |
| 2012/0257993 A1 | 10/2012 | Ono et al. | |
| 2013/0034456 A1 | 2/2013 | Schoegler | |
| 2013/0088176 A1* | 4/2013 | Kwon ..................... H02K 7/14 318/3 | |
| 2013/0189119 A1 | 7/2013 | Dainez et al. | |
| 2013/0243607 A1 | 9/2013 | Dainez et al. | |
| 2014/0072461 A1 | 3/2014 | Barito et al. | |
| 2014/0186194 A1 | 7/2014 | Dainez et al. | |
| 2014/0234137 A1 | 8/2014 | Roman et al. | |
| 2014/0333236 A1 | 11/2014 | Yamanaka et al. | |
| 2015/0125323 A1 | 5/2015 | Stair et al. | |
| 2015/0226195 A1 | 8/2015 | Mallampalli et al. | |
| 2016/0215767 A1 | 7/2016 | Kusumba et al. | |
| 2016/0215770 A1 | 7/2016 | Kusumba et al. | |
| 2016/0215772 A1 | 7/2016 | Kusumba et al. | |
| 2016/0305420 A1 | 10/2016 | Adler et al. | |
| 2017/0009762 A1 | 1/2017 | Lilie et al. | |
| 2017/0122305 A1 | 5/2017 | Kusumba et al. | |
| 2017/0122309 A1* | 5/2017 | Kusumba ................ F04B 51/00 | |

FOREIGN PATENT DOCUMENTS

| | | |
|---|---|---|
| JP | H09287558 | 11/1997 |
| JP | 2003315205 A | 11/2003 |
| JP | 3762469 B2 | 4/2006 |
| WO | WO 0079671 A1 | 12/2000 |
| WO | WO 2005/028841 | 3/2005 |
| WO | WO 2006/013377 | 2/2006 |
| WO | WO 2006/081642 | 8/2006 |
| WO | WO 2013/003923 | 1/2013 |

(56) References Cited

FOREIGN PATENT DOCUMENTS

OTHER PUBLICATIONS

Bidikli et al., A New Robust 'Integral of Sign of Error' Feedback Controller with Adaptive Compensation Gain, 52nd IEEE Conference on Decision and Control, Dec. 10-13, 2013, Florence, Italy, pp. 3782-3787.
Chen et al., Accurate Motion Control of Linear Motors with Adaptive Robust Compensation of Nonlinear Electromagnetic Field Effect, (Proceedings of the ASME 2011 Dynamic Systems and Control Conference, DSCC 2011, Oct. 31-Nov. 2, 2011, Arlington, VA, USA, DSCC2011-5991), 8 pages.
Chiang et al., Innovative Linear Compressor by Magnetic Drive and Control, (Proceedings of 2011 International Conference on Modelling, Identification and Control, Shanghai, China, Jun. 26-29, 2011), pp. 300-305.
Mantri et al., Development and Validation of Integrated Design Framework for Compressor System Model, Purdue University / Purdue e-Pubs, International Compressor Engineering Conference, School of Mechanical Engineering, 2014 (10 pages).
Mehta et al., Principles of Electrical Engineering and Electronics, Jan. 1, 2006, S. Chand & Company Ltd., 2nd Ed., pp. 275-277.
Smith, The Scientist and Engineer's Guide to Digital Signal Processing, Second Edition, published 1999, 22 pages.
Xian et al., A Continuous Asymptotic Tracking Control Strategy for Uncertain Nonlinear Systems, IEEE Transactions on Automatic Control, vol. 49, No. 7, Jul. 2004, pp. 1206-1211.

\* cited by examiner

METHOD FOR DETECTING HEAD CRASHING IN A LINEAR COMPRESSOR

FIELD OF THE INVENTION

The present subject matter relates generally to linear compressors, such as linear compressors for refrigerator appliances.

BACKGROUND OF THE INVENTION

Certain refrigerator appliances include sealed systems for cooling chilled chambers of the refrigerator appliances. The sealed systems generally include a compressor that generates compressed refrigerant during operation of the sealed systems. The compressed refrigerant flows to an evaporator where heat exchange between the chilled chambers and the refrigerant cools the chilled chambers and food items located therein.

Recently, certain refrigerator appliances have included linear compressors for compressing refrigerant. Linear compressors generally include a piston and a driving coil. A voltage excitation induces a current within the driving coil that generates a force for sliding the piston forward and backward within a chamber. During motion of the piston within the chamber, the piston compresses refrigerant. Motion of the piston within the chamber is generally controlled such that the piston does not crash against another fixed component of the linear compressor during motion of the piston within the chamber. Such hard head crashing can damage various components of the linear compressor, such as the piston or an associated cylinder. While hard head crashing is preferably avoided, it can be difficult to accurately control a motor of the linear compressor to avoid hard head crashing.

Accordingly, a method for operating a linear compressor with features for avoiding hard head crashing would be useful. In particular, a method for operating a linear compressor with features for avoiding head crashing without utilizing a position sensor would be useful.

BRIEF DESCRIPTION OF THE INVENTION

The present subject matter provides a method for detecting head crashing in a linear compressor. The method includes sampling a rolling average of a peak applied voltage and a desired peak current each time that a current controller adjusts the desired peak current. The method also includes calculating a linear regression for a predicted peak applied voltage as a function of the desired peak current, calculating the predicted peak voltage for the motor of the linear compressor with the linear regression and a current value for the desired peak current from the current controller, and establishing that a piston of the linear compressor is soft crashing when the rolling average of the peak applied voltage is greater than the predicted peak voltage by more than a threshold value. Additional aspects and advantages of the invention will be set forth in part in the following description, or may be apparent from the description, or may be learned through practice of the invention.

In a first example embodiment, a method for detecting head crashing in a linear compressor is provided. The method includes operating the motor of the linear compressor with a current controller that drives the motor to a desired peak current, filtering a peak applied voltage to provide a rolling average of the peak applied voltage, and adjusting the desired peak current. The method also includes, each time that the desired peak current is adjusted, sampling the rolling average of the peak applied voltage and the desired peak current from immediately prior to adjusting the desired peak current in order to fill a buffer with a plurality of values for the rolling average of the peak applied voltage and for the desired peak current. The method further includes calculating a linear regression for a predicted peak applied voltage as a function of the desired peak current with the plurality of values from the buffer, calculating the predicted peak voltage for the motor of the linear compressor with the linear regression and a current value for the desired peak current from the current controller, comparing the predicted peak voltage with a current value for the rolling average of the peak applied voltage, establishing that a piston of the linear compressor is soft crashing when the rolling average of the peak applied voltage is greater than the predicted peak voltage by more than a threshold value, and adjusting operation of the motor to prevent further soft crashing of the piston.

In a second example embodiment, a method for detecting head crashing in a linear compressor is provided. The method includes operating the motor of the linear compressor with a current controller that drives the motor to a desired peak current, filtering a peak applied voltage to provide a rolling average of the peak applied voltage, adjusting the desired peak current, sampling the rolling average of the peak applied voltage and the desired peak current each time that the desired peak current is adjusted at the current controller in order to fill a buffer with a plurality of values for the rolling average of the peak applied voltage and for the desired peak current, calculating a linear regression for a predicted peak applied voltage as a function of the desired peak current with the plurality of values from the buffer, calculating the predicted peak voltage for the motor of the linear compressor with the linear regression and a current value for the desired peak current from the current controller, comparing the predicted peak voltage with a current value for the rolling average of the peak applied voltage, and establishing that a piston of the linear compressor is soft crashing against a discharge valve of the linear compressor when the rolling average of the peak applied voltage is greater than the predicted peak voltage by more than a threshold value.

In a third example embodiment, a method for detecting head crashing in a linear compressor includes operating the motor of the linear compressor with a current controller that drives the motor to a desired peak current, incrementally adjusting the desired peak current, and, each time that the desired peak current is adjusted, sampling the peak applied voltage and the desired peak current from immediately prior to adjusting the desired peak current in order to fill a buffer with a plurality of values for peak applied voltage and for the desired peak current. The method also includes calculating a predicted peak applied voltage based upon a current value for the desired peak current from the current controller and the plurality of values from the buffer, comparing the predicted peak voltage with a current value for the peak applied voltage, establishing that a piston of the linear compressor is soft crashing against a discharge valve of the linear compressor when the current value for the peak applied voltage is greater than the predicted peak voltage by more than a threshold value, adjusting operation of the motor to prevent further soft crashing of the piston.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

DETAILED DESCRIPTION

Figure 1:
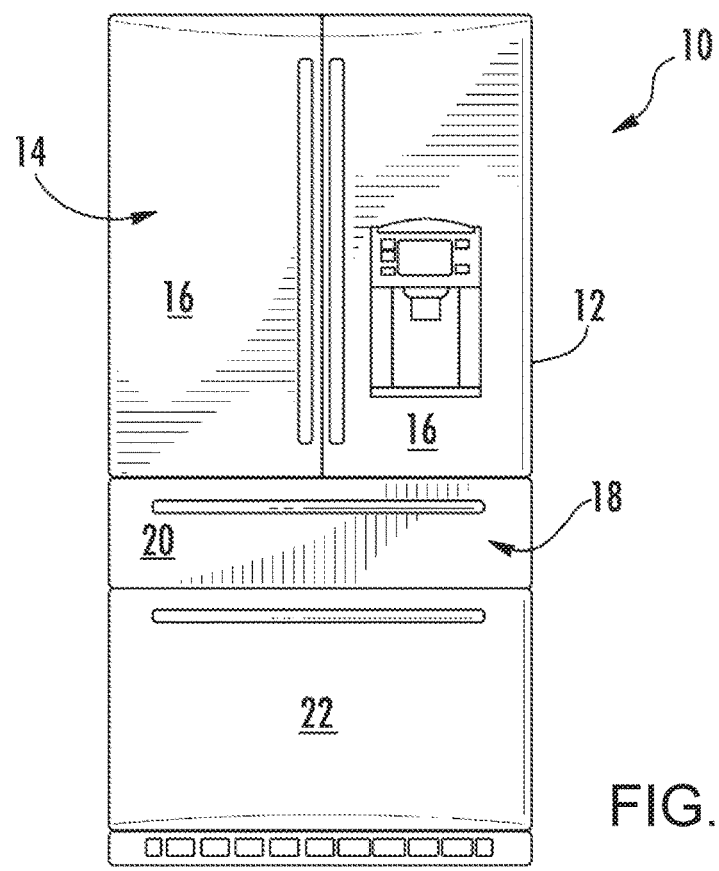
FIG. 1 is a front elevation view of a refrigerator appliance according to an example embodiment of the present subject matter.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Figure 2:
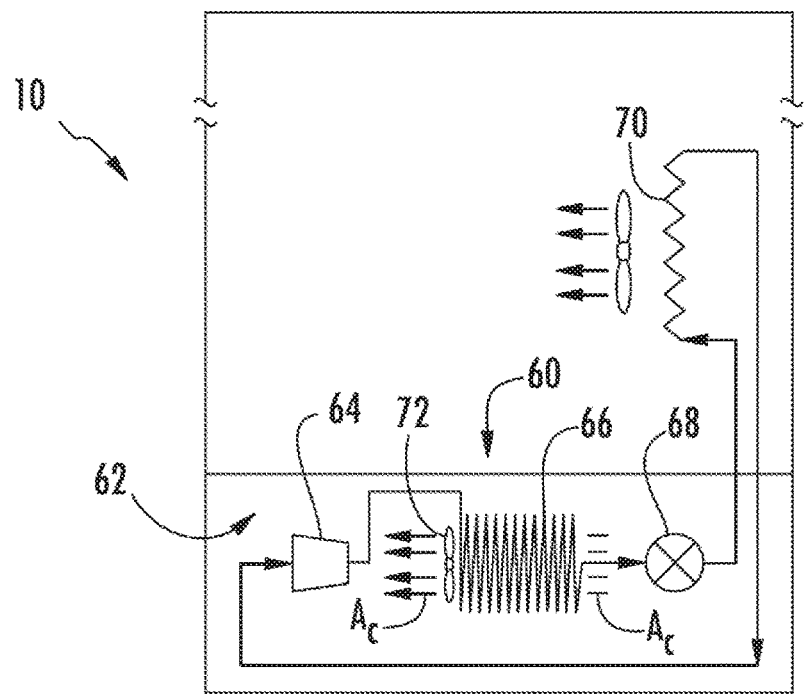
FIG. 2 is schematic view of certain components of the example refrigerator appliance of FIG. 1.

FIG. 1 depicts a refrigerator appliance 10 that incorporates a sealed refrigeration system 60 (FIG. 2). It should be appreciated that the term "refrigerator appliance" is used in a generic sense herein to encompass any manner of refrigeration appliance, such as a freezer, refrigerator/freezer combination, and any style or model of conventional refrigerator. In addition, it should be understood that the present subject matter is not limited to use in appliances. Thus, the present subject matter may be used for any other suitable purpose, such as vapor compression within air conditioning units or air compression within air compressors.

In the illustrated example embodiment shown in FIG. 1, the refrigerator appliance 10 is depicted as an upright refrigerator having a cabinet or casing 12 that defines a number of internal chilled storage compartments. In particular, refrigerator appliance 10 includes upper fresh-food compartments 14 having doors 16 and lower freezer compartment 18 having upper drawer 20 and lower drawer 22. The drawers 20 and 22 are "pull-out" drawers in that they can be manually moved into and out of the freezer compartment 18 on suitable slide mechanisms.

FIG. 2 is a schematic view of certain components of refrigerator appliance 10, including a sealed refrigeration system 60 of refrigerator appliance 10. A machinery compartment 62 contains components for executing a known vapor compression cycle for cooling air. The components include a compressor 64, a condenser 66, an expansion device 68, and an evaporator 70 connected in series and charged with a refrigerant. As will be understood by those skilled in the art, refrigeration system 60 may include additional components, e.g., at least one additional evaporator, compressor, expansion device, and/or condenser. As an example, refrigeration system 60 may include two evaporators.

Within refrigeration system 60, refrigerant flows into compressor 64, which operates to increase the pressure of the refrigerant. This compression of the refrigerant raises its temperature, which is lowered by passing the refrigerant through condenser 66. Within condenser 66, heat exchange with ambient air takes place so as to cool the refrigerant. A fan 72 is used to pull air across condenser 66, as illustrated by arrows $A_C$, so as to provide forced convection for a more rapid and efficient heat exchange between the refrigerant within condenser 66 and the ambient air. Thus, as will be understood by those skilled in the art, increasing air flow across condenser 66 can, e.g., increase the efficiency of condenser 66 by improving cooling of the refrigerant contained therein.

An expansion device (e.g., a valve, capillary tube, or other restriction device) 68 receives refrigerant from condenser 66. From expansion device 68, the refrigerant enters evaporator 70. Upon exiting expansion device 68 and entering evaporator 70, the refrigerant drops in pressure. Due to the pressure drop and/or phase change of the refrigerant, evaporator 70 is cool relative to compartments 14 and 18 of refrigerator appliance 10. As such, cooled air is produced and refrigerates compartments 14 and 18 of refrigerator appliance 10. Thus, evaporator 70 is a type of heat exchanger which transfers heat from air passing over evaporator 70 to refrigerant flowing through evaporator 70.

Collectively, the vapor compression cycle components in a refrigeration circuit, associated fans, and associated compartments are sometimes referred to as a sealed refrigeration system operable to force cold air through compartments 14, 18 (FIG. 1). The refrigeration system 60 depicted in FIG. 2 is provided by way of example only. Thus, it is within the scope of the present subject matter for other configurations of the refrigeration system to be used as well.

Figure 3:
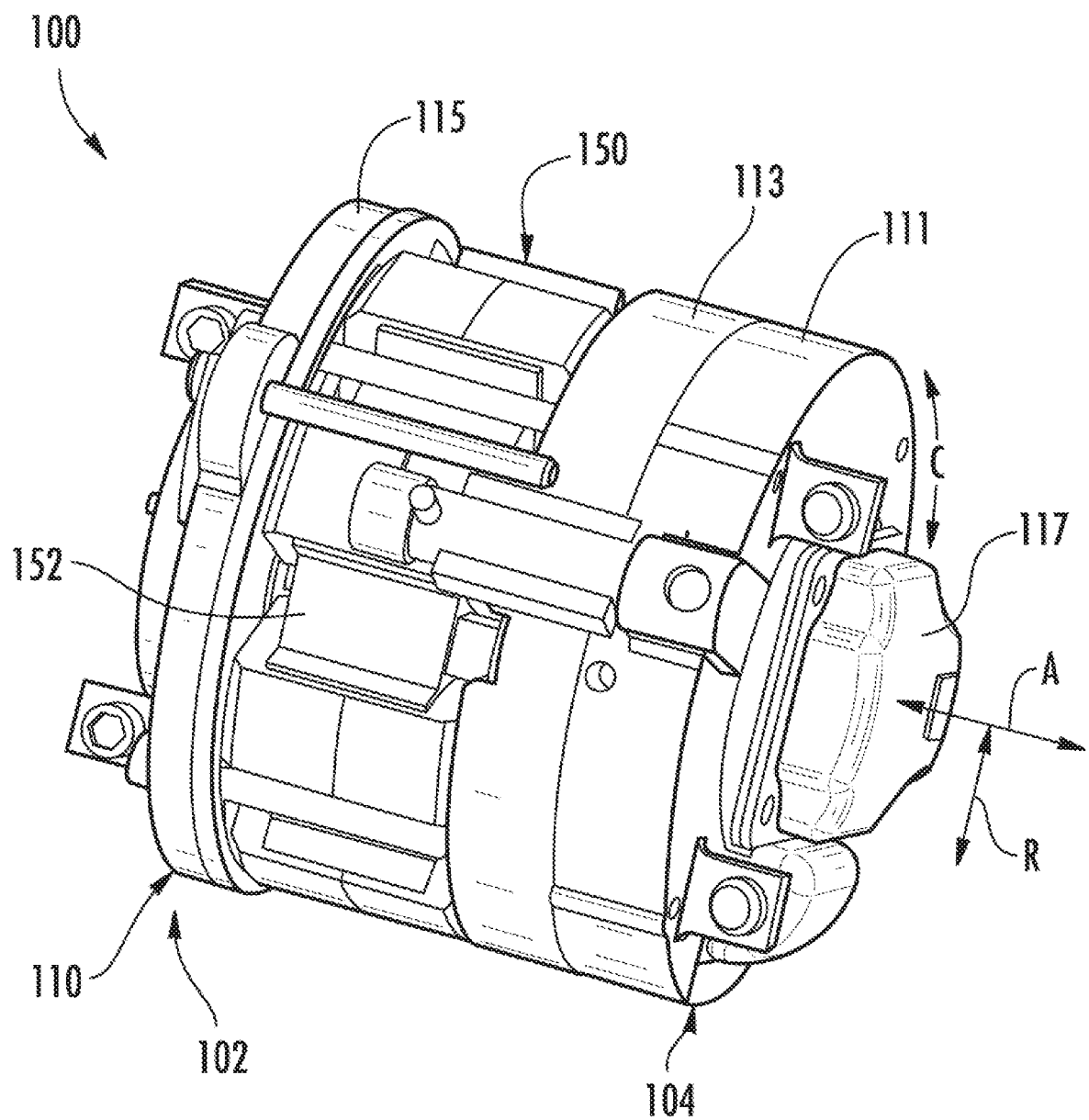
FIG. 3 is a perspective view of a linear compressor according to an example embodiment of the present subject matter.
Figure 4:
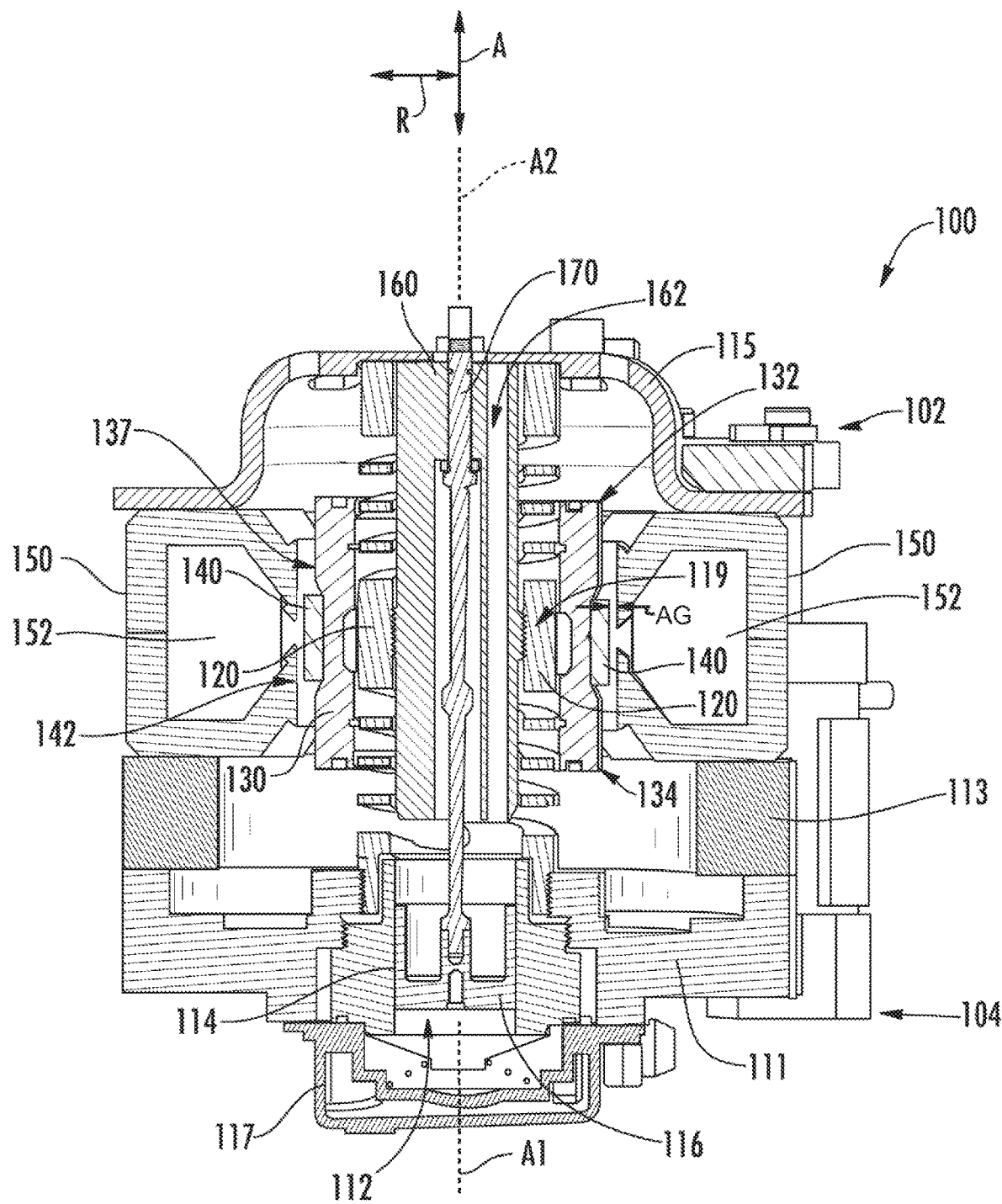
FIG. 4 is a side section view of the example linear compressor of FIG. 3.
Figure 5:
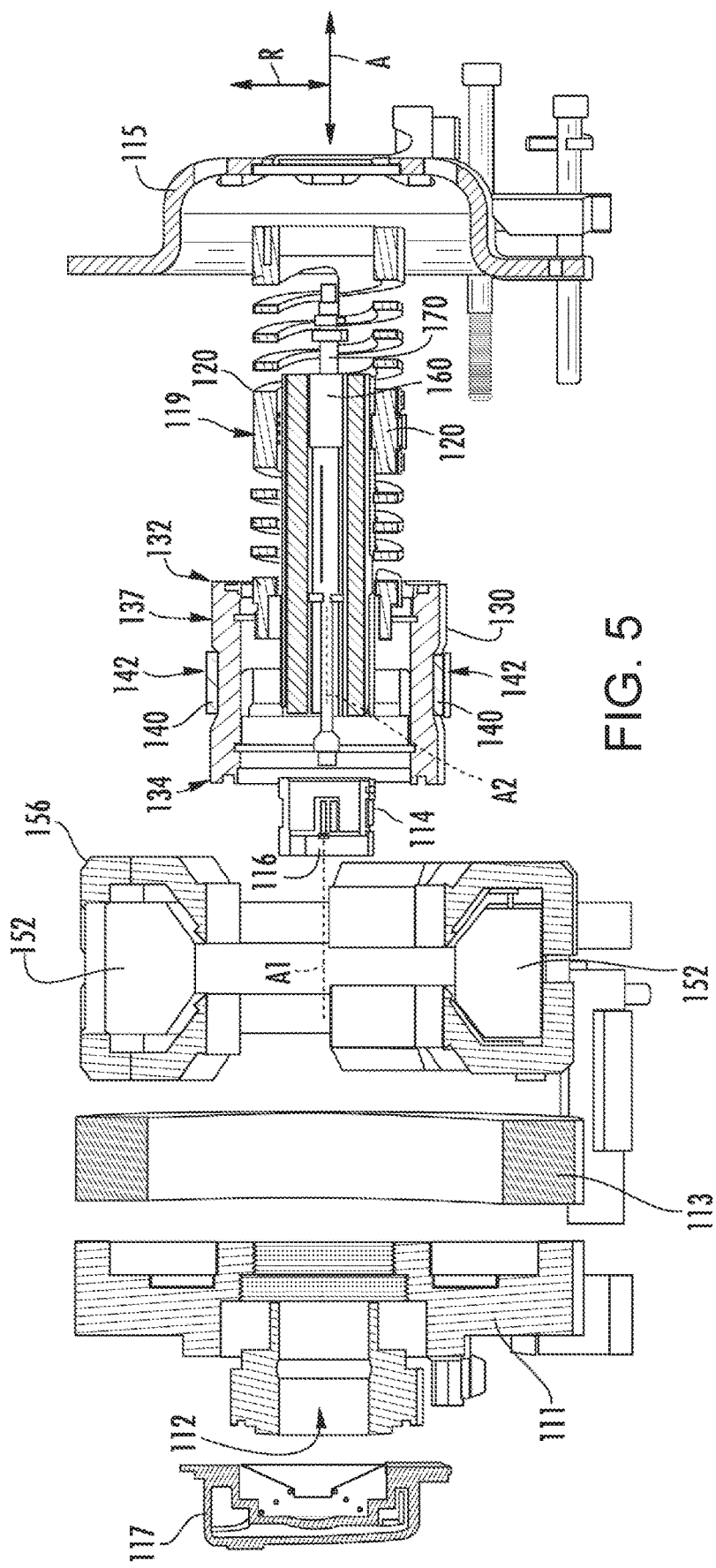
FIG. 5 is an exploded view of the example linear compressor of FIG. 4.

FIG. 3 provides a perspective view of a linear compressor 100 according to an example embodiment of the present subject matter. FIG. 4 provides a side section view of linear compressor 100. FIG. 5 provides an exploded side section view of linear compressor 100. As discussed in greater detail below, linear compressor 100 is operable to increase a pressure of fluid within a chamber 112 of linear compressor 100. Linear compressor 100 may be used to compress any suitable fluid, such as refrigerant or air. In particular, linear compressor 100 may be used in a refrigerator appliance, such as refrigerator appliance 10 (FIG. 1) in which linear compressor 100 may be used as compressor 64 (FIG. 2). As may be seen in FIG. 3, linear compressor 100 defines an axial direction A, a radial direction R and a circumferential direction C. Linear compressor 100 may be enclosed within a hermetic or air-tight shell (not shown). The hermetic shell can, e.g., hinder or prevent refrigerant from leaking or escaping from refrigeration system 60.

Turning now to FIG. 4, linear compressor 100 includes a casing 110 that extends between a first end portion 102 and a second end portion 104, e.g., along the axial direction A. Casing 110 includes various static or non-moving structural components of linear compressor 100. In particular, casing 110 includes a cylinder assembly 111 that defines a chamber 112. Cylinder assembly 111 is positioned at or adjacent second end portion 104 of casing 110. Chamber 112 extends longitudinally along the axial direction A. Casing 110 also includes a motor mount mid-section 113 and an end cap 115 positioned opposite each other about a motor. A stator, e.g., including an outer back iron 150 and a driving coil 152, of the motor is mounted or secured to casing 110, e.g., such that the stator is sandwiched between motor mount mid-section 113 and end cap 115 of casing 110. Linear compressor 100 also includes valves (such as a discharge valve assembly 117 at an end of chamber 112) that permit refrigerant to enter and exit chamber 112 during operation of linear compressor 100.

A piston assembly 114 with a piston head 116 is slidably received within chamber 112 of cylinder assembly 111. In particular, piston assembly 114 is slidable along a first axis A1 within chamber 112. The first axis A1 may be substantially parallel to the axial direction A. During sliding of piston head 116 within chamber 112, piston head 116 compresses refrigerant within chamber 112. As an example, from a top dead center position, piston head 116 can slide within chamber 112 towards a bottom dead center position along the axial direction A, i.e., an expansion stroke of piston head 116. When piston head 116 reaches the bottom dead center position, piston head 116 changes directions and slides in chamber 112 back towards the top dead center position, i.e., a compression stroke of piston head 116. It should be understood that linear compressor 100 may include an additional piston head and/or additional chamber at an opposite end of linear compressor 100. Thus, linear compressor 100 may have multiple piston heads in alternative example embodiments.

Linear compressor 100 also includes an inner back iron assembly 130. Inner back iron assembly 130 is positioned in the stator of the motor. In particular, outer back iron 150 and/or driving coil 152 may extend about inner back iron assembly 130, e.g., along the circumferential direction C. Inner back iron assembly 130 extends between a first end portion 132 and a second end portion 134, e.g., along the axial direction A.

Inner back iron assembly 130 also has an outer surface 137. At least one driving magnet 140 is mounted to inner back iron assembly 130, e.g., at outer surface 137 of inner back iron assembly 130. Driving magnet 140 may face and/or be exposed to driving coil 152. In particular, driving magnet 140 may be spaced apart from driving coil 152, e.g., along the radial direction R by an air gap AG. Thus, the air gap AG may be defined between opposing surfaces of driving magnet 140 and driving coil 152. Driving magnet 140 may also be mounted or fixed to inner back iron assembly 130 such that an outer surface 142 of driving magnet 140 is substantially flush with outer surface 137 of inner back iron assembly 130. Thus, driving magnet 140 may be inset within inner back iron assembly 130. In such a manner, the magnetic field from driving coil 152 may have to pass through only a single air gap (e.g., air gap AG) between outer back iron 150 and inner back iron assembly 130 during operation of linear compressor 100, and linear compressor 100 may be more efficient than linear compressors with air gaps on both sides of a driving magnet.

As may be seen in FIG. 4, driving coil 152 extends about inner back iron assembly 130, e.g., along the circumferential direction C. Driving coil 152 is operable to move the inner back iron assembly 130 along a second axis A2 during operation of driving coil 152. The second axis may be substantially parallel to the axial direction A and/or the first axis A1. As an example, driving coil 152 may receive a current from a current source (not shown) in order to generate a magnetic field that engages driving magnet 140 and urges piston assembly 114 to move along the axial direction A in order to compress refrigerant within chamber 112 as described above and will be understood by those skilled in the art. In particular, the magnetic field of driving coil 152 may engage driving magnet 140 in order to move inner back iron assembly 130 along the second axis A2 and piston head 116 along the first axis A1 during operation of driving coil 152. Thus, driving coil 152 may slide piston assembly 114 between the top dead center position and the bottom dead center position, e.g., by moving inner back iron assembly 130 along the second axis A2, during operation of driving coil 152.

A piston flex mount 160 is mounted to and extends through inner back iron assembly 130. A coupling 170 extends between piston flex mount 160 and piston assembly 114, e.g., along the axial direction A. Thus, coupling 170 connects inner back iron assembly 130 and piston assembly 114 such that motion of inner back iron assembly 130, e.g., along the axial direction A or the second axis A2, is transferred to piston assembly 114. Piston flex mount 160 defines an input passage 162 that permits refrigerant to flow therethrough.

Linear compressor 100 may include various components for permitting and/or regulating operation of linear compressor 100. In particular, linear compressor 100 includes a controller (not shown) that is configured for regulating operation of linear compressor 100. The controller is in, e.g., operative, communication with the motor, e.g., driving coil 152 of the motor. Thus, the controller may selectively activate driving coil 152, e.g., by supplying voltage to driving coil 152, in order to compress refrigerant with piston assembly 114 as described above.

The controller includes memory and one or more processing devices such as microprocessors, CPUs or the like, such as general or special purpose microprocessors operable to execute programming instructions or micro-control code associated with operation of linear compressor 100. The memory can represent random access memory such as DRAM, or read only memory such as ROM or FLASH. The processor executes programming instructions stored in the memory. The memory can be a separate component from the processor or can be included onboard within the processor. Alternatively, the controller may be constructed without using a microprocessor, e.g., using a combination of discrete analog and/or digital logic circuitry (such as switches, amplifiers, integrators, comparators, flip-flops, AND gates, field programmable gate arrays (FPGA), and the like) to perform control functionality instead of relying upon software.

Linear compressor 100 also includes a spring assembly 120. Spring assembly 120 is positioned in inner back iron assembly 130. In particular, inner back iron assembly 130 may extend about spring assembly 120, e.g., along the circumferential direction C. Spring assembly 120 also extends between first and second end portions 102 and 104 of casing 110, e.g., along the axial direction A. Spring assembly 120 assists with coupling inner back iron assembly 130 to casing 110, e.g., cylinder assembly 111 of casing 110.

In particular, inner back iron assembly 130 is fixed to spring assembly 120 at a middle portion 119 of spring assembly 120.

During operation of driving coil 152, spring assembly 120 supports inner back iron assembly 130. In particular, inner back iron assembly 130 is suspended by spring assembly 120 within the stator or the motor of linear compressor 100 such that motion of inner back iron assembly 130 along the radial direction R is hindered or limited while motion along the second axis A2 is relatively unimpeded. Thus, spring assembly 120 may be substantially stiffer along the radial direction R than along the axial direction A. In such a manner, spring assembly 120 can assist with maintaining a uniformity of the air gap AG between driving magnet 140 and driving coil 152, e.g., along the radial direction R, during operation of the motor and movement of inner back iron assembly 130 on the second axis A2. Spring assembly 120 can also assist with hindering side pull forces of the motor from transmitting to piston assembly 114 and being reacted in cylinder assembly 111 as a friction loss.

The various mechanical and electrical parameters or constants of linear compressor 100 may be established or determined in any suitable manner. For example, the various mechanical and electrical parameters or constants of linear compressor 100 may be established or determined using the methodology described in U.S. Patent Publication No. 2016/0215772, which is hereby incorporated by reference in its entirety. For example, the methodology described in U.S. Patent Publication No. 2016/0215772 may be used to determine or establish a spring constant of spring assembly 120, a motor force constant of the motor of linear compressor 100, a damping coefficient of linear compressor 100, a resistance of the motor of linear compressor 100, an inductance of the motor of linear compressor 100, a moving mass (such as mass of piston assembly 114 and inner back iron assembly 130) of linear compressor 100, etc. Knowledge of such mechanical and electrical parameters or constants of linear compressor 100 may improve performance or operation of linear compressor 100. In alternative example embodiments, a manufacturer of linear compressor 100 may provide nominal values for the various mechanical and electrical parameters or constants of linear compressor 100. The various mechanical and electrical parameters or constants of linear compressor 100 may also be measured or estimated using any other suitable method or mechanism.

Figure 6:
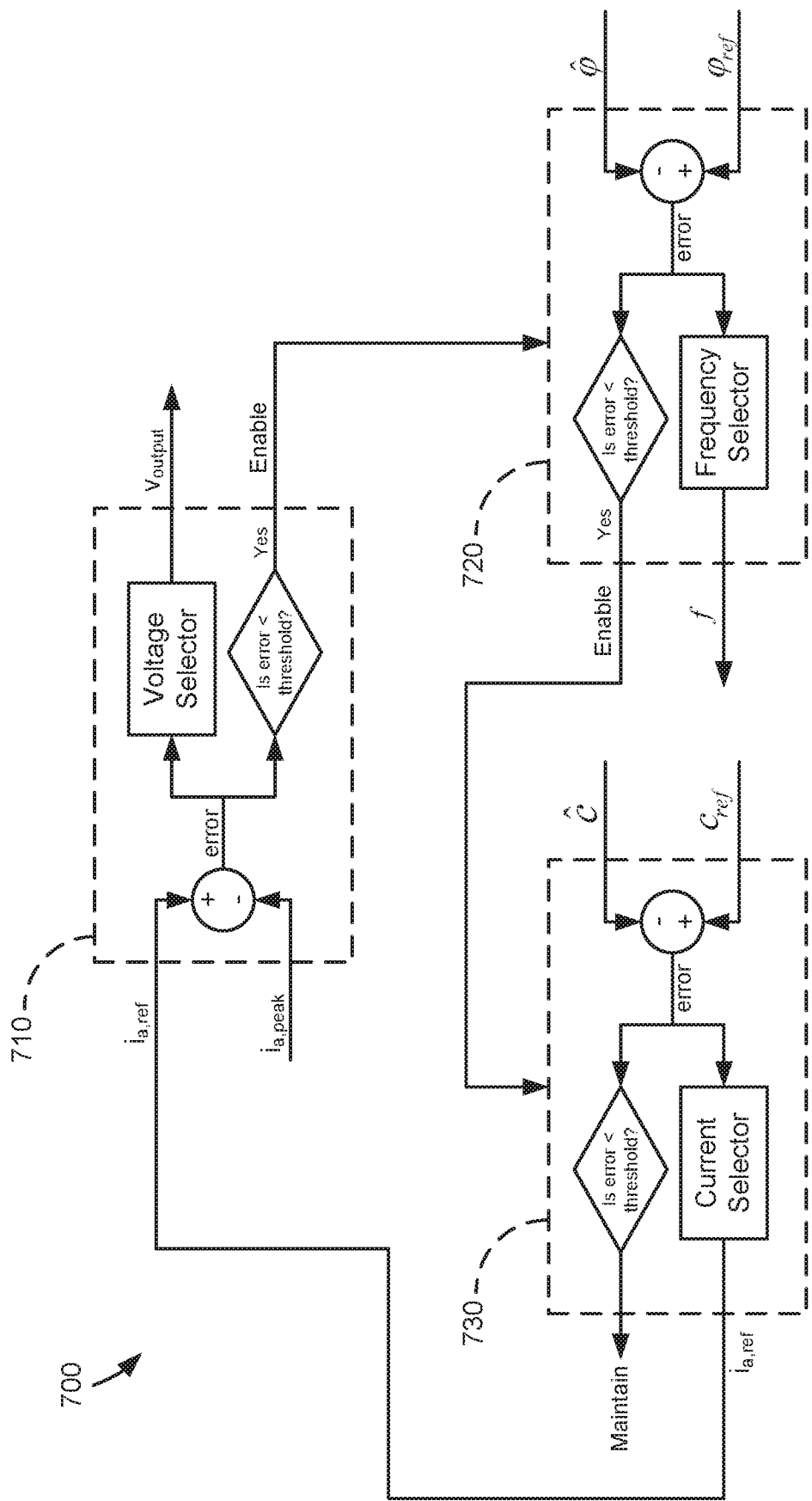
FIG. 6 illustrates a method for operating a linear compressor according to another example embodiment of the present subject matter.

FIG. 6 illustrates a method 700 for operating a linear compressor according to another example embodiment of the present subject matter. Method 700 may be used to operate any suitable linear compressor. For example, method 700 may be used to operate linear compressor 100 (FIG. 3). The controller of method 700 may be programmed or configured to implement method 700. Thus, method 700 is discussed in greater detail below with reference to linear compressor 100. Utilizing method 700, the motor of linear compressor 100 may be operating according to various control methods.

As may be seen in FIG. 6, method 700 includes providing a current controller 710, a resonance controller 720 and a clearance controller 730. Method 700 selectively operates linear compressor with one of current controller 710, resonance controller 720 and clearance controller 730. Thus, at least one of current controller 710, resonance controller 720 and clearance controller 730 selects or adjusts operational parameters of the motor of linear compressor 100, e.g., in order to efficiently reciprocate piston assembly 114 and compress fluid within chamber 112. Switching between current controller 710, resonance controller 720 and clearance controller 730 may improve performance or operation of linear compressor 100, as discussed in greater detail below.

Current controller 710 may be the primary control for operation of linear compressor 100 during method 700. Current controller 710 is configured for adjusting the supply voltage $v_{output}$ to linear compressor 100. For example, current controller 710 may be configured to adjust a peak voltage or amplitude of the supply voltage $v_{output}$ to linear compressor 100. Current controller 710 may adjust the supply voltage $v_{output}$ in order to reduce a difference or error between a peak current, $i_{a,peak}$, supplied to linear compressor 100 and a reference peak current $i_{a,ref}$. The peak current $i_{a,peak}$ may be measured or estimated utilizing any suitable method or mechanism. For example, an ammeter may be used to measure the peak current $i_{a,peak}$. The voltage selector of current controller 710 may operate as a proportional-integral (PI) controller in order to reduce the error between the peak current $i_{a,peak}$ and the reference peak current $i_{a,ref}$. At a start of method 700, the reference peak current $i_{a,ref}$ may be a default value, and clearance controller 730 may adjust (e.g., increase or decrease) the reference peak current $i_{a,ref}$ during subsequent steps of method 700, as discussed in greater detail below, such that method 700 reverts to current controller 710 in order to adjust the amplitude of the supply voltage $v_{output}$ and reduce the error between the peak current $i_{a,peak}$ supplied to linear compressor 100 and the adjusted reference peak current $i_{a,ref}$ from clearance controller 730.

Figure 7:
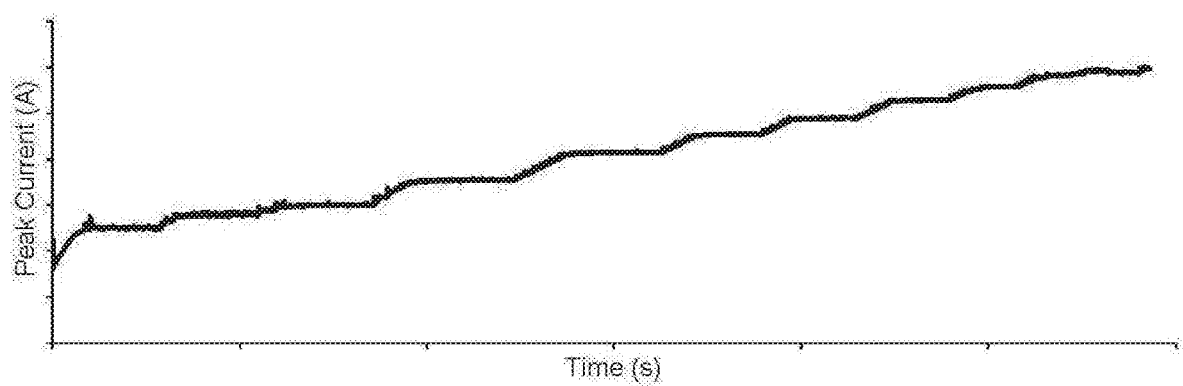
FIGS. 7, 8 and 9 illustrate example plots of various operating conditions of the linear compressor during the method of FIG. 6.
Figure 8:
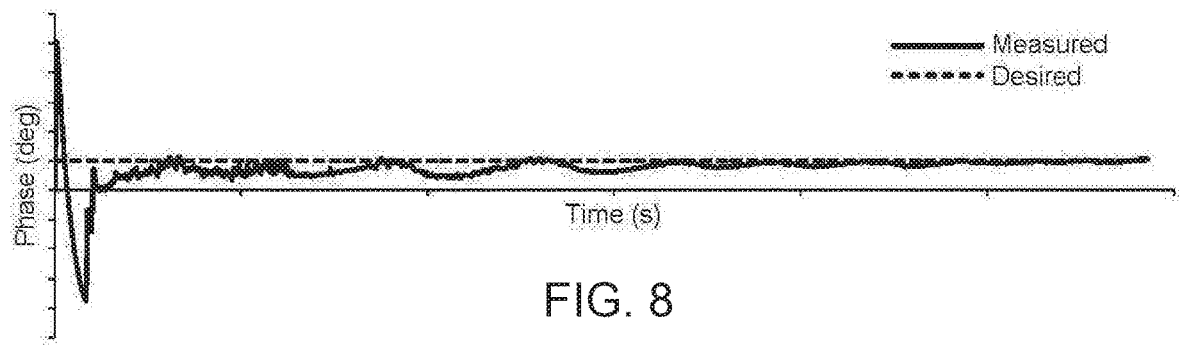

As shown in FIG. 6, current controller 710 continues to determine or regulate the amplitude of the supply voltage $v_{output}$ when the error between the peak current $i_{a,peak}$ and the reference peak current $i_{a,ref}$ is greater than (e.g., or outside) a threshold current error. Conversely, current controller 710 passes off determining or regulating the supply voltage $v_{output}$ to resonance controller 720 when the error between the peak current $i_{a,peak}$ and the reference peak current $i_{a,ref}$ is less than (e.g., or within) the threshold current error. Thus, when the current induced the motor of linear compressor 100 settles, method 700 passes control of the supply voltage $v_{output}$ from current controller 710 to resonance controller 720, e.g., as shown in FIGS. 7 and 8. However, it should be understood that current controller 710 may be always activated or running during method 700, e.g., such that current controller 710 is always determining or regulating the supply voltage $v_{output}$ to ensure that the error between the peak current $i_{a,peak}$ and the reference peak current greater than (e.g., or outside) the threshold current error.

Resonance controller 720 is configured for adjusting the supply voltage $V_{output}$. For example, when activated or enabled, resonance controller 720 may adjust the phase or frequency of the supply voltage $v_{output}$ in order to reduce a phase difference or error between a reference phase, $\varphi_{ref}$, and a phase between (e.g., zero crossings of) an observed velocity, $\hat{v}$ or $\hat{x}$, of the motor linear compressor 100 and a current, $i_a$, induced in the motor of linear compressor 100. The reference phase $\varphi_{ref}$ may be any suitable phase. For example, the reference phase $\varphi_{ref}$ may be ten degrees. As another example, the reference phase $\varphi_{ref}$ may be one degree. Thus, resonance controller 720 may operate to regulate the supply voltage $v_{output}$ in order to drive the motor linear compressor 100 at about a resonant frequency. As used herein, the term "about" means within five degrees of the stated phase when used in the context of phases.

For the resonance controller 720, the current $i_a$ induced in the motor of linear compressor 100 may be measured or estimated utilizing any suitable method or mechanism. For example, an ammeter may be used to measure the current $i_a$. The observed velocity $\hat{x}$ of the motor linear compressor 100 may be estimated or observed utilizing an electrical dynamic model for the motor of linear compressor 100. Any suitable electrical dynamic model for the motor of linear compressor 100 may be utilized. For example, the electrical dynamic model for the motor of linear compressor 100 described above for step 610 of method 600 may be used. The electrical dynamic model for the motor of linear compressor 100 may also be modified such that $$\frac{di}{dt} = \frac{v_a}{L_i} - \frac{r_i i}{L_i} - f$$

where $f = \frac{\alpha}{L_i}\dot{x}$.

A back-EMF of the motor of linear compressor 100 may be estimated using at least the electrical dynamic model for the motor of linear compressor 100 and a robust integral of the sign of the error feedback. As an example, the back-EMF of the motor of linear compressor 100 may be estimated by solving $$\hat{f}=(K_1+1)e(t)+\int_{t_0}^{t}[(K_1+1)e(\sigma)+K_2\,\mathrm{sgn}(e(\sigma))]d\sigma-(K_1+1)e(t_0)$$

where
$\hat{f}$ is an estimated back-EMF of the motor of linear compressor 100;
$K_1$ and $K_2$ are real, positive gains; and
$e=\hat{i}-i$ and $\dot{e}=f-\hat{f}$; and
sgn(•) is the signum or sign function.

In turn, the observed velocity $\hat{x}$ of the motor of linear compressor 100 may be estimated based at least in part on the back-EMF of the motor. For example, the observed velocity $\hat{x}$ of the motor of linear compressor 100 may be determined by solving $$\hat{\dot{x}} = \frac{L_i}{\alpha}\hat{f}$$

$\hat{\dot{x}}$ is the estimated or observed velocity $\hat{x}$ of the motor of linear compressor 100;
$\alpha$ is a motor force constant; and
$L_i$ is an inductance of the motor of linear compressor 100.
The motor force constant and the inductance of the motor of linear compressor 100 may be estimated with method 600, as described above.

Figure 9:
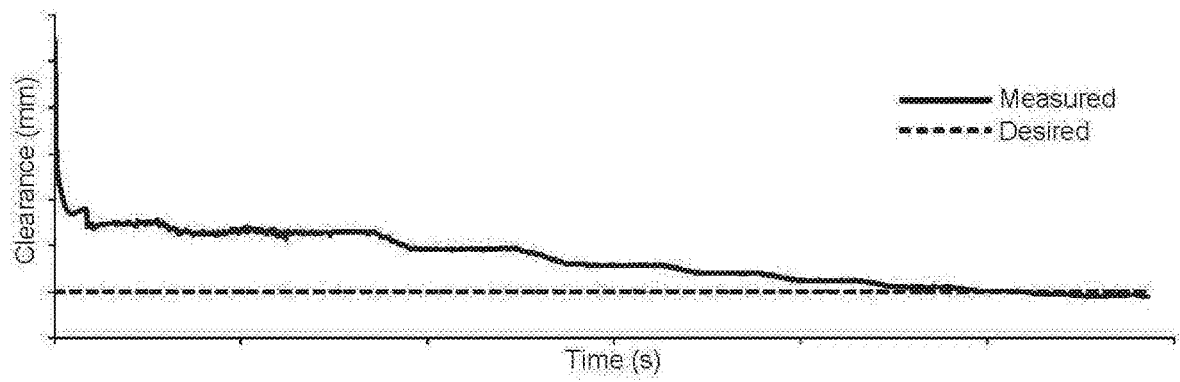

As shown in FIG. 6, resonance controller 720 continues to determine or regulate the frequency of the supply voltage $v_{output}$ when the error between the reference phase $\varphi_{ref}$ and the phase between the observed velocity $\hat{x}$ and the current $i_a$ is greater than (e.g., or outside) a threshold phase error. Conversely, resonance controller 720 passes off determining or regulating the supply voltage $v_{output}$ to clearance controller 730 when the error between the reference phase $\varphi_{ref}$ and the phase between the observed velocity $\hat{x}$ and the current $i_a$ is less than (e.g., or within) the threshold phase error. Thus, when the motor linear compressor 100 is operating at about a resonant frequency, method 700 passes control of the supply voltage $v_{output}$ from resonance controller 720 to clearance controller 730, e.g., as shown in FIGS. 8 and 9.

The threshold phase error may be any suitable phase. For example, the voltage selector of resonance controller 720 may utilize multiple threshold phase errors in order to more finely or accurately adjust the phase or frequency of the supply voltage $v_{output}$ to achieve a desired frequency for linear compressor 100. For example, a first threshold phase error, a second threshold phase error and a third threshold phase error may be provided and sequentially evaluated by the voltage selector of resonance controller 720 to adjust the frequency during method 700. The first phase clearance error may be about twenty degrees, and resonance controller 720 may successively adjust (e.g., increase or decrease) the frequency by about one hertz until the error between the reference phase $\varphi_{ref}$ and the phase between the observed velocity $\hat{x}$ and the current $i_a$ is less than the first threshold phase error. The second threshold phase error may be about five degrees, and resonance controller 720 may successively adjust (e.g., increase or decrease) the frequency by about a tenth of a hertz until the error between the reference phase $\varphi_{ref}$ and the phase between the observed velocity $\hat{x}$ and the current $i_a$ is less than the second threshold phase error. The third threshold phase error may be about one degree, and resonance controller 720 may successively adjust (e.g., increase or decrease) the frequency by about a hundredth of a hertz until the error between the reference phase $\varphi_{ref}$ and the phase between the observed velocity $\hat{x}$ and the current $i_a$ is less than the third threshold phase error. As used herein, the term "about" means within ten percent of the stated frequency when used in the context of frequencies.

Clearance controller 730 is configured for adjusting the reference peak current $i_{a,ref}$. For example, when activated or enabled, clearance controller 730 may adjust the reference peak current $i_{a,ref}$ in order to reduce a difference or error between an observed clearance, $\hat{c}$, of the motor of linear compressor 100 and a reference clearance, $c_{ref}$. Thus, clearance controller 730 may operate to regulate the reference peak current $i_{a,ref}$ in order to drive the motor linear compressor 100 at about a particular clearance between piston head 116 and discharge valve assembly 117. The reference clearance $c_{ref}$ may be any suitable distance. For example, the reference clearance $c_{ref}$ may be about two millimeters, about one millimeter or about a tenth of a millimeter. As used herein, the term "about" means within ten percent of the stated clearance when used in the context of clearances.

As shown in FIG. 6, clearance controller 730 continues to determine or regulate the reference peak current $i_{a,ref}$, e.g., when the error between the observed clearance $\hat{c}$ of the motor of linear compressor 100 and a reference clearance $c_{ref}$ is greater than (e.g., or outside) a threshold clearance error. Thus, clearance controller 730 operates the motor linear compressor 100 to avoid head crashing. When, the error between the observed clearance $\hat{c}$ of the motor of linear compressor 100 and the reference clearance $c_{ref}$ is less than (e.g., or inside) the threshold clearance error, method 700 may maintain linear compressor 100 at current operation conditions, e.g., such that the supply voltage $v_{output}$ is stable or regular.

The threshold clearance error may be any suitable clearance. For example, the voltage selector of clearance controller 730 may utilize multiple threshold clearance errors in order to more finely or accurately adjust the supply voltage $v_{output}$ to achieve a desired clearance. In particular, a first threshold clearance error, a second threshold clearance error and a third threshold clearance error may be provided and sequentially evaluated by the voltage selector of clearance controller 730 to adjust a magnitude of a change to the current $i_a$ during method 700. The first threshold clearance error may be about two millimeters, and clearance controller 730 may successively adjust (e.g., increase or decrease) the current $i_a$ by about twenty milliamps until the error between the observed clearance ĉ of the motor of linear compressor 100 and the reference clearance $c_{ref}$ is less than the first threshold clearance error. The second threshold clearance error may be about one millimeter, and clearance controller 730 may successively adjust (e.g., increase or decrease) the current $i_a$ by about ten milliamps until the error between the observed clearance ĉ of the motor of linear compressor 100 and the reference clearance $c_{ref}$ is less than the second threshold clearance error. The third threshold clearance error may be about a tenth of a millimeter, and clearance controller 730 may successively adjust (e.g., increase or decrease) the current $i_a$ by about five milliamps until the error between the observed clearance ĉ of the motor of linear compressor 100 and the reference clearance $c_{ref}$ is less than the third threshold clearance error. As used herein, the term "about" means within ten percent of the stated current when used in the context of currents.

As discussed above, current controller 710 determines or regulates the amplitude of the supply voltage $v_{output}$ when the error between the peak current $i_{a,peak}$ and the reference peak current $i_{a,ref}$ is greater than (e.g., or outside) a threshold current error. By modifying the reference peak current $i_{a,ref}$, clearance controller 730 may force the error between the peak current $i_{a,peak}$ and the reference peak current $i_{a,ref}$ to be greater than (e.g., or outside) the threshold current error. Thus, priority may shift back to current controller 710 after clearance controller 730 adjusts the reference peak current $i_{a,ref}$, e.g., until current controller 710 again settles the current induced in the motor of linear compressor 100 as described above.

It should be understood that method 700 may be performed with the motor of linear compressor 100 sealed within a hermitic shell of linear compressor 100. Thus, method 700 may be performed without directly measuring velocities or positions of moving components of linear compressor 100. Utilizing method 700, the supply voltage $v_{output}$ may be adjusted by current controller 710, resonance controller 720 and/or clearance controller 730 in order to operate the motor of linear compressor 100 at a resonant frequency of the motor of linear compressor 100 without or limited head crashing. Thus, method 700 provides robust control of clearance and resonant tracking, e.g., without interference and run away conditions. For example, current controller 710 may be always running and tracking the peak current $i_{a,peak}$, e.g., as a PI controller, and resonant controller 720 and clearance controller 730 provide lower priority controls, with resonant controller 720 having a higher priority relative to clearance controller 730.

Figure 10:
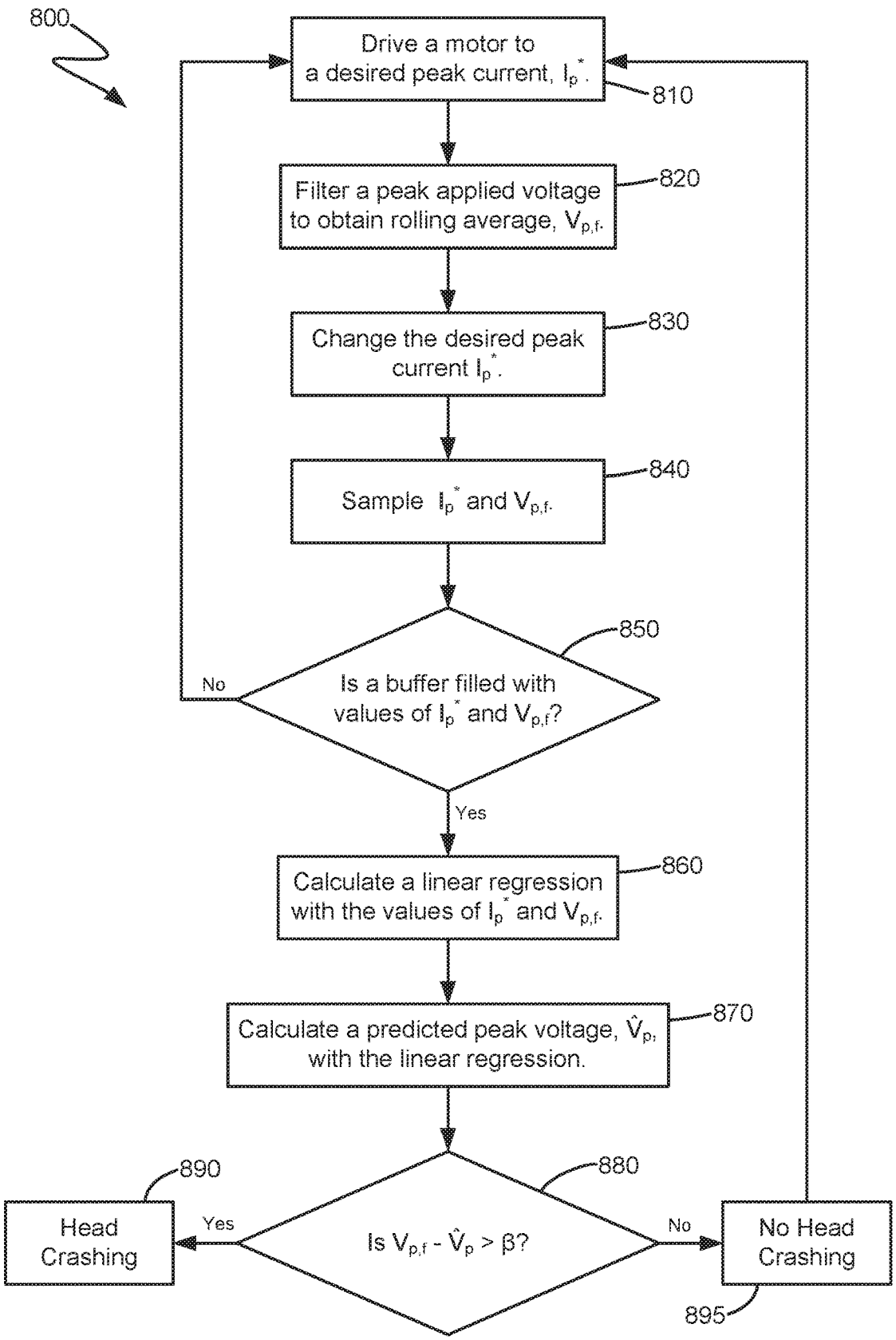
FIG. 10 illustrates a method for operating a linear compressor according to another example embodiment of the present subject matter.

FIG. 10 illustrates a method 800 for operating a linear compressor according to another example embodiment of the present subject matter. Method 800 may be used to operate any suitable linear compressor. For example, method 800 may be used to operate linear compressor 100 (FIG. 3). The controller of method 800 may be programmed or configured to implement method 800. Thus, method 800 is discussed in greater detail below with reference to linear compressor 800.

During operation of linear compressor 100, the motor of linear compressor 100 reciprocates piston assembly 114. Piston assembly 114 may impact discharge valve 117 during operation of linear compressor 100. When piston assembly 114 impacts a valve head of discharge valve 117 or other movable component of linear compressor 100, such crashing is referred to herein as "soft crashing." Soft crashing is generally not harmful to piston assembly 114 or discharge valve 117. In contrast, when piston assembly 114 impacts a fixed component of linear compressor 100 (e.g., when piston assembly 114 moves the valve head of discharge valve 117 so that the valve head impacts a housing of discharge valve 117), such crashing is referred to herein as "hard crashing." Hard crashing can damage piston assembly 114 and other components of linear compressor 100 and can also be noisy. Thus, hard crashing is preferably avoided. As discussed in greater detail below, method 800 may assist with detecting soft crashing, e.g., to avoid overdriving piston assembly 114 into hard crashing. Thus, method 800 may improve performance of linear compressor, e.g., relative to methods that allow hard crashing, by adjusting operation of linear compressor 100 to avoid overdriving piston assembly 114 into hard crashing.

During soft crashing, discharge valve 117 is opened a prolonged time, and fluid within discharge valve 117 pushes against piston assembly 114 as piston assembly 114 moves away from discharge valve 117 during the suction stroke of piston assembly 114. The gas force applied by the fluid within discharge valve 117 increases a kinetic energy of piston assembly 114 and thus a velocity of piston assembly 114. The increase in velocity in turn increases a back EMF of the motor of linear compressor 100 as seen in the following electrical dynamic model $$v_a = r_i i + L_i \frac{di}{dt} + e_a$$

where $e_a = \alpha \dot{x}$ and is the back EMF of the motor.

From the above electrical dynamic model, it can be seen that, as the back EMF increases, the voltage required to maintain a consistent current also increases. In method 800, current controller 710 is monitored to observe when the supply voltage $v_{output}$ exceeds an expected supply voltage by a threshold amount. The expected supply voltage is determined based on a linear regression of current and voltage data points collected over step changes to the reference peak current $i_{a,ref}$. When the supply voltage $v_{output}$ exceeds the expected supply voltage by more than the threshold amount, it may be inferred that piston assembly 114 is soft crashing. Method 800 is discussed in greater detail below in the context of FIGS. 10 and 11.

At 810, method 800 includes operating the motor of linear compressor 100 with current controller 710. Thus, current controller 710 may drive the motor of linear compressor 100 to a desired peak current, $i_p^*$ (e.g., the reference peak current $i_{a,ref}$), at 810. In particular, current controller 710 may adjust the supply voltage $v_{output}$ in order to reduce a difference or error between the peak current $i_{a,peak}$ supplied to linear compressor 100 and the desired peak current $i_p^*$.

At 820, a peak applied voltage, $v_p$, of the motor of linear compressor 100 (e.g., a peak of the voltage applied to driving coil 152) is filtered to provide a rolling average of the peak applied voltage, $v_{p,f}$. As an example, the peak applied voltage $v_p$ may be filtered with the following to obtain the rolling average of the peak applied voltage $v_{p,f}$ $$V_{P_f} = \frac{1}{N} \sum_{i=0}^{N-1} V_p(t - iT)$$

where
$V_{P_f}$ is the rolling average of the peak applied voltage,

N is a number of elements in the rolling average,
i is an index of the elements
t is time, and
T is a period of the applied voltage.

Thus, the peak applied voltage $v_p$ may be filtered using an N-element rolling average filter updated once per cycle based on the system fundamental period T. In certain example embodiments, the number of elements N may be no less than five elements. In particular, the number of elements N may be eight elements.

Figure 11:
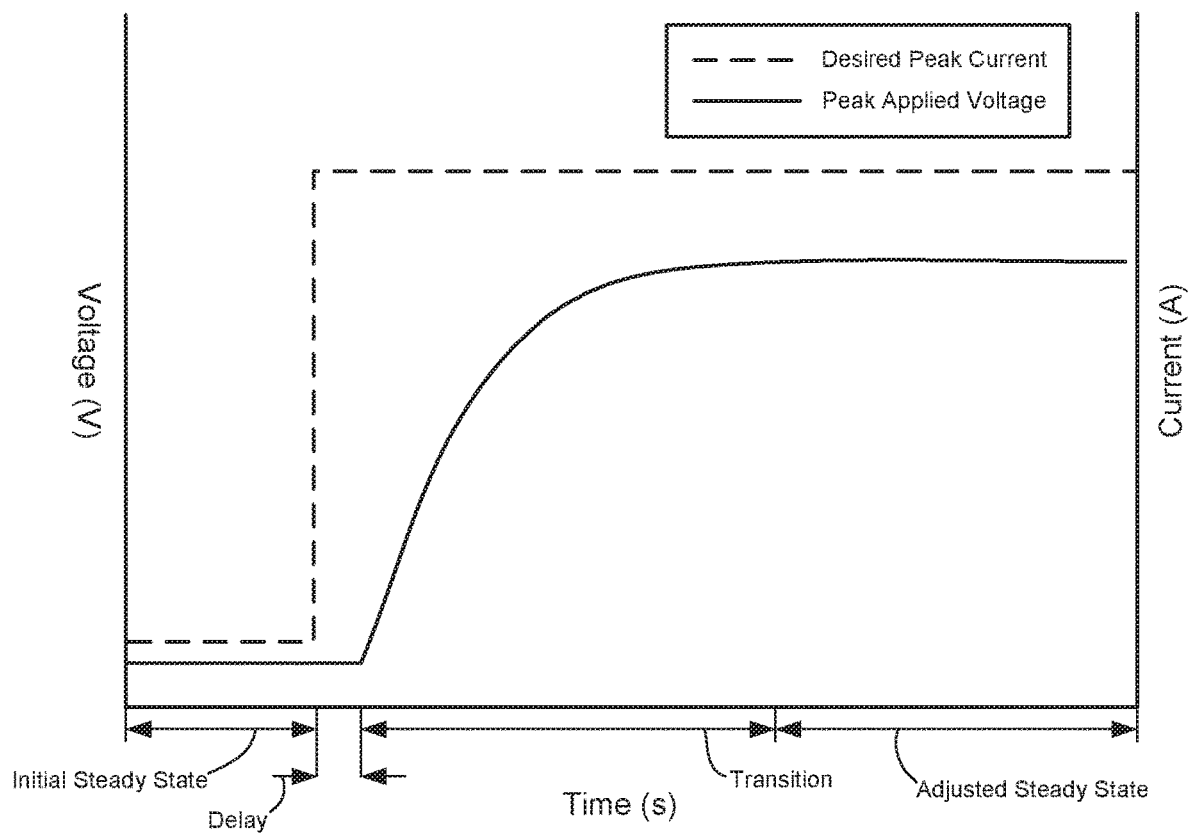
FIG. 11 illustrates example plots of a desired peak voltage and a peak applied voltage versus time during the method of FIG. 10.

At 830, current controller 710 or clearance controller 730 changes the desired peak current $i_p^*$ (e.g., incrementally). For example, current controller 710 may increase the desired peak current $i_p^*$ in order to increase a stroke length of piston assembly 114. When current controller 710 increases the desired peak current $i_p^*$, current controller 710 may also increase the peak applied voltage $v_p$ in order to decrease the difference between the peak current $i_{a,peak}$ supplied to linear compressor 100 and the adjusted desired peak current $i_p^*$. Step 830 will be described in greater detail with reference to FIG. 11. FIG. 11 illustrates example plots of the desired peak current $i_p^*$ and the peak applied voltage $v_p$ versus time during method 800.

With reference to FIG. 11, current controller 710 may change the desired peak current $i_p^*$ from an initial desired peak current $i_p^*$ to an adjusted desired peak current $i_p^*$ as shown in the stepwise change in the desired peak current $i_p^*$ in FIG. 11. In FIG. 11, current controller 710 drives the peak current $i_{a,peak}$ supplied to linear compressor 100 towards the initial desired peak current $i_p^*$ during the initial steady state portion labeled in FIG. 11. Current controller 710 changes the desired peak current $i_p^*$ from the initial desired peak current $i_p^*$ to the adjusted desired peak current $i_p^*$ at a beginning of the delay portion labeled in FIG. 11. Current controller 710 then drives the peak current $i_{a,peak}$ supplied to linear compressor 100 towards the adjusted desired peak current $i_p^*$ during the transition and adjusted steady state portion labeled in FIG. 11.

At 840, method 800 includes sampling the rolling average of the peak applied voltage $v_{p,f}$ and the desired peak current $i_p^*$ and adding the values to a buffer. With reference to FIG. 11, the sampling rolling average of the peak applied voltage $v_{p,f}$ may be sampled at about when the desired peak current $i_p^*$ is adjusted with current controller 710 at 830, e.g., at an end of the initial steady state portion or during the delay portion in FIG. 11. Thus, the rolling average of the peak applied voltage $v_{p,f}$ may be sampled at 840 after current controller 710 has the longest possible time to adjust the supply voltage $v_{output}$ to a steady state condition. In such a manner, sampling of transient behavior (e.g., from the transition period shown in FIG. 11) in the rolling average of the peak applied voltage $v_{p,f}$ at 840 may be avoided or reduced. The desired peak current $i_p^*$ may be sampled immediately prior to adjusting the desired peak current $i_p^*$ with current controller 710 at 830. Thus, the initial desired peak current $i_p^*$ from the initial steady state portion may be sampled at 840. As may be seen from the above, method 800 waits for a change in desired peak current $i_p^*$ at 830 and then adds values of the sampling rolling average of the peak applied voltage $v_{p,f}$ and the desired peak current $i_p^*$ to a buffer at 840.

During method 800, the rolling average of the peak applied voltage $v_{p,f}$ and the desired peak current $i_p^*$ may be sampled each time that clearance controller 730 adjusts the desired peak current $i_p^*$. Thus, a buffer may be filled with a plurality of values for the rolling average of the peak applied voltage $v_{p,f}$ and the desired peak current $i_p^*$. The buffer may have any suitable number of elements. For example, the buffer may be a five element buffer. Thus, the buffer may be filled with five value pairs of the rolling average of the peak applied voltage $v_{p,f}$ and the desired peak current $i_p^*$. The buffer may delete the oldest value pair each time that a new value pair is sampled and added to the buffer.

At 850, method 800 continues to 860 if the buffer is full. Conversely, method 800 loops back to 810 if buffer is not full in order to collect additional value pairs for the buffer. At 860, a linear regression for a predicted peak applied voltage, $\hat{v}_p$, as a function of the desired peak current $i_p^*$ is calculated with the plurality of values from the buffer. The linear regression for the predicted peak applied voltage $\hat{v}_p$ may be calculated with the following $$y = mx + b$$

where
y is the predicted peak applied voltage $\hat{v}_p$,
x is the desired peak current $i_p^*$, $$m = \frac{N \sum_{i=1}^{N}(x_i y_i) - \sum_{i=1}^{N} x_i \sum_{i=1}^{N} y_i}{N \sum_{i=1}^{N} x_i^2 - (\sum_{i=1}^{N} x_i)^2},$$

$$b = \frac{\sum_{i=1}^{N} y_i - m \sum_{i=1}^{N} x_i}{N},$$

i is an index of the values from the buffer, and
N is a number of predicted peak applied voltages in the buffer.

With the linear regression, the predicted peak voltage $\hat{v}_p$ may be calculated at 870. Thus, a current or present value for the desired peak current $i_p^*$ may be plugged in to the linear regression to calculate the predicted peak voltage $\hat{v}_p$. In particular, the adjusted desired peak current $i_p^*$ from FIG. 11 may be plugged into the linear regression as the x variable, and the output of the linear regression, the y variable, may correspond to the predicted peak voltage $\hat{v}_p$. It will be understood that the linear regression equation may be updated every time a new value is added to the buffer at 840.

The predicted peak voltage $\hat{v}_p$ is the value of the peak voltage which the linear regression predicts the current controller 710 will need to supply to achieve the desired peak current $i_p^*$ based on historical data from the buffer. At 880, the predicted peak voltage $\hat{v}_p$ is compared to a current value for the rolling average of the peak applied voltage $v_{p,f}$. In particular, the predicted peak voltage $\hat{v}_p$ may be compared to the rolling average of the peak applied voltage $v_{p,f}$ from the end of the adjusted steady state portion or the delay portion of FIG. 11.

At 890, method 800 may establish that piston assembly 114 is soft crashing against discharge valve 117 when the current value for the rolling average of the peak applied voltage $v_{p,f}$ is greater than the predicted peak voltage $\hat{v}_p$ by more than a threshold value. The threshold value may be selected to provide a confident inference that piston assembly 114 is soft crashing against discharge valve 117. After 890, method 800 may include adjusting operation of the motor of linear compressor 100 to prevent hard crashing of piston assembly 114 against a fixed component of linear compressor 100 and/or to prevent additional soft crashing of piston assembly 114. Thus, e.g., current controller 710 may decrement or maintain the desired peak current $i_p^*$ when the piston assembly 114 is soft crashing against discharge 117 at 890. In contrast, method 800 may establish that piston assembly 114 is not soft crashing against discharge valve 117 at 895 when the predicted peak voltage $\hat{v}_p$ is not different than the current value for the rolling average of the peak applied voltage $v_{p,f}$ by more than the threshold value. Thus, method 800 may cycle back to 810.

As may be seen from the above, method 800 may provide a sensorless method for detecting soft crashing of piston assembly 114 against discharge valve 117. Thus, damage to piston assembly 114 from hard crashing of piston assembly 114 or excessive soft crashing of piston assembly 114 may be avoided or limited using method 800. As a particular example, when method 800 detects soft crashing of piston assembly 114, clearance controller 730 may adjust the reference peak current $i_{a,ref}$ in order to reduce soft crashing.

Additionally, method 800 may provide a sensorless method to establish the axial location of an end of cylinder assembly 111 by tracking the calculated clearance level on the increment of current prior to the soft crash condition occurring. This information can be used to correct the calculated clearance to establish the zero clearance point of piston assembly 114 within cylinder assembly 111. By utilizing method 800 in plurality, multiple instances of soft crashing can be observed with a correction value for the end of cylinder assembly 111 for each instance. This data can then be further evaluated for consistency and used to establish more accurately the location of the end or head of cylinder assembly 111 for purposes of improving the clearance calculation accuracy.

A clearance Δ may be defines as a minimum distance between piston assembly 114 and a head of discharge valve 117, e.g., that occurs when piston assembly 114 is at the top dead center position. As a particular example, an existing clearance estimation Δ' may be added to a clearance adjustment variable $\Delta_{adj}$ (initially zero) to obtain an adjusted clearance estimation $\hat{\Delta}$. The adjusted clearance estimation $\hat{\Delta}$ may be filtered, e.g., using a rolling average filter, to smooth the sampled values. Method 800 then provides a time $t_{sc}$ at which piston assembly 114 starts soft crashing. At time $t_{sc}$, the adjusted clearance estimation $\hat{\Delta}$ is sampled and subtracted from an expected soft crash clearance $\Delta_{sc}$ to obtain an error value $\tilde{\Delta}$. The error value $\tilde{\Delta}$ may be added to a rolling buffer of values of the most recent soft crash events. A mean and a range of the error values $\tilde{\Delta}$ in the rolling buffer may be determined. If the range of the error values $\tilde{\Delta}$ is less than a given threshold $r_{th}$, it may be inferred that the data is sufficiently consistent, and the buffer may be cleared and the mean of the error values $\tilde{\Delta}$ may be added to the previous value of the clearance adjustment variable $\Delta_{adj}$. The new clearance adjustment variable $\Delta_{adj}$ may then be saturated to a given range, e.g. $[-\Delta_{lim}, +\Delta_{lim}]$ to ensure that the calibration method does not overcorrect or become unstable.

To assist with avoiding false soft crashing flags at 890, method may include applying exclusion conditions at 880 in addition to comparing the predicted peak voltage $\hat{v}_p$ to the rolling average of the peak applied voltage $v_{p,f}$. For example, in certain example embodiments, a minimum velocity of piston assembly 114 must be less than a threshold velocity for method 880 to continue to 890. As another example, in certain example embodiments, the predicted peak voltage $\hat{v}_p$ must be different than the current value for the rolling average of the peak applied voltage $v_{p,f}$ by more than the threshold value AND a previous predicted peak voltage $\hat{v}_p$ must also be different than a previous value for the rolling average of the peak applied voltage $v_{p,f}$ by more than the threshold value. Thus, in certain example embodiments, two consecutive peak applied voltage $v_{p,f}$ must be greater than the respective value for the predicted peak voltage $\hat{v}_p$ by more than the threshold value for method 800 to establish that piston assembly 114 is soft crashing against discharge valve 117.

The table provided below shows experimental data accumulated while operating a compressor with method 800. As may be seen in the table, the peak applied voltage $v_p$ is larger in during soft crashes compared to before the soft crash (i.e., with clearances).

| Current (A) | Peak Voltage (V) | Clearance (mm) | Minimum Velocity (m/s) | Stroke Length (mm) | Notes |
|---|---|---|---|---|---|
| 1.48 | 213.00 | −0.22 | −2.38 | 14.54 | Before Soft Crash |
| 1.49 | 290.00 | −1.41 | −2.80 | 17.60 | Soft Crash |
| 1.22 | 195.00 | −0.15 | −2.27 | 14.15 | Before Soft Crash |
| 1.24 | 211.00 | −0.81 | −2.50 | 15.80 | Soft Crash |
| 1.65 | 227.00 | −0.25 | −2.43 | 14.81 | Before Soft Crash |
| 1.67 | 289.00 | −0.8 | −2.85 | 16+ | Soft Crash |
| 1.89 | 246.00 | −0.35 | −2.51 | 15.16 | Before Soft Crash |
| 1.91 | 292.00 | −1.91 | −2.90 | 17.70 | Soft Crash |
| 1.93 | 270.00 | −0.21 | −2.70 | 15.80 | Before Soft Crash |
| 1.95 | 292.00 | −1.01 | −2.85 | 16.90 | Soft Crash |

As may be seen from the above, within method 800, soft crashing of piston assembly 114 may be detected by monitoring the rolling average of the peak applied voltage $v_{p,f}$ in the manner described above.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for detecting head crashing in a linear compressor, comprising:
   operating a motor of the linear compressor with a current controller that drives the motor to a desired peak current;
   filtering a peak applied voltage to provide a rolling average of the peak applied voltage;
   adjusting the desired peak current;
   each time that the desired peak current is adjusted, sampling the rolling average of the peak applied voltage and the desired peak current from immediately prior to adjusting the desired peak current in order to fill a buffer with a plurality of values for the rolling average of the peak applied voltage and for the desired peak current;
   calculating a linear regression for a predicted peak applied voltage as a function of the desired peak current with the plurality of values from the buffer;
   calculating the predicted peak voltage for the motor of the linear compressor with the linear regression and a current value for the desired peak current from the current controller;
   comparing the predicted peak voltage with a current value for the rolling average of the peak applied voltage;
   establishing that a piston of the linear compressor is soft crashing against a discharge valve of the linear compressor when the current value for the rolling average of the peak applied voltage is greater than the predicted peak voltage by more than a threshold value; and adjusting operation of the motor to prevent further soft crashing of the piston.

2. The method of claim 1, wherein establishing that the piston of the linear compressor is soft crashing further comprises establishing that the piston of the linear compressor is soft crashing both when the current value for the rolling average of the peak applied voltage is greater than the predicted peak voltage by more than the threshold value and when a minimum velocity of the piston is less than a threshold velocity.

3. The method of claim 2, wherein establishing that the piston of the linear compressor is soft crashing further comprises establishing that the piston of the linear compressor is soft crashing when the predicted peak voltage is different than the current value for the rolling average of the peak applied voltage by more than the threshold value and when a previous predicted peak voltage is different than a previous value for the rolling average of the peak applied voltage by more than the threshold value.

4. The method of claim 1, wherein filtering the peak applied voltage comprises filtering the peak applied voltage with $$V_{P_f} = \frac{1}{N} \sum_{i=0}^{N-1} V_p(t - iT)$$

where
  $V_{P_f}$ is the rolling average of the peak applied voltage,
  N is a number of elements in the rolling average,
  i is an index of the elements
  $V_p$ is the peak applied voltage as a function of time t, and
  T is a period of the applied voltage.

5. The method of claim 4, wherein N is no less than five.

6. The method of claim 1, wherein the buffer is a five-element buffer wherein each element comprises a respective value for the rolling average of the peak applied voltage and a respective value for the desired peak current.

7. The method of claim 1, wherein calculating the linear regression for the predicted peak applied voltage as a function of the desired peak current with the plurality of values from the buffer comprises calculating the linear regression with $$y = mx + b$$

where
  y is the predicted peak applied voltage,
  x is the desired peak current, $$m = \frac{N \sum_{i=1}^{N}(x_i y_i) - \sum_{i=1}^{N} x_i \sum_{i=1}^{N} y_i}{N \sum_{i=1}^{N} x_i^2 - (\sum_{i=1}^{N} x_i)^2},$$

$$b = \frac{\sum_{i=1}^{N} y_i - m \sum_{i=1}^{N} x_i}{N},$$

i is an index of the values from the buffer, and
  N is a number of predicted peak applied voltages in the buffer.

8. The method of claim 7, wherein N is no less than five.

9. The method of claim 1, wherein the current controller is a PI current controller.

10. The method of claim 1, further comprising:
calculating a position of the piston of the linear compressor when the piston is soft crashing against the discharge valve of the linear compressor; and calibrating a clearance value between the piston of the linear compressor and the discharge valve of the linear compressor based upon an error between the calculated position of the piston of the linear compressor when the piston is soft crashing against the discharge valve of the linear compressor and an estimated clearance value.

11. A method for detecting head crashing in a linear compressor, comprising:

operating a motor of the linear compressor with a current controller that drives the motor to a desired peak current;

filtering a peak applied voltage to provide a rolling average of the peak applied voltage;

adjusting the desired peak current;

sampling the rolling average of the peak applied voltage and the desired peak current each time that the desired peak current is adjusted at the current controller in order to fill a buffer with a plurality of values for the rolling average of the peak applied voltage and for the desired peak current;

calculating a linear regression for a predicted peak applied voltage as a function of the desired peak current with the plurality of values from the buffer;

calculating the predicted peak voltage for the motor of the linear compressor with the linear regression and a current value for the desired peak current from the current controller;

comparing the predicted peak voltage with a current value for the rolling average of the peak applied voltage; and establishing that a piston of the linear compressor is soft crashing against a discharge valve of the linear compressor when the current value for the rolling average of the peak applied voltage is greater than the predicted peak voltage by more than a threshold value.

12. The method of claim 11, wherein establishing that the piston of the linear compressor is soft crashing further comprises establishing that the piston of the linear compressor is soft crashing both when the current value for the rolling average of the peak applied voltage is greater than the predicted peak voltage by more than the threshold value and when a minimum velocity of the piston is less than a threshold velocity.

13. The method of claim 12, wherein establishing that the piston of the linear compressor is soft crashing further comprises establishing that the piston of the linear compressor is soft crashing when both when the current value for the rolling average of the peak applied voltage is greater than the predicted peak voltage by more than the threshold value and the predicted peak voltage is different than the current value for the rolling average of the peak applied voltage by more than the threshold value and when a previous predicted peak voltage is different than a previous value for the rolling average of the peak applied voltage by more than the threshold value.

14. The method of claim 11, wherein filtering the peak applied voltage comprises filtering the peak applied voltage with $$V_{P_f} = \frac{1}{N} \sum_{i=0}^{N-1} V_p(t - iT)$$

where $V_{P_f}$ is the rolling average of the peak applied voltage,

N is a number of elements in the rolling average, i is an index of the elements $V_p$ is the peak applied voltage as a function of time t, and T is a period of the applied voltage.

15. The method of claim 14, wherein N is no less than five.

16. The method of claim 11, wherein the buffer is a five-element buffer wherein each element comprises a respective value for the rolling average of the peak applied voltage and a respective value for the desired peak current.

17. The method of claim 11, wherein calculating the linear regression for the predicted peak applied voltage as a function of the desired peak current with the plurality of values from the buffer comprises calculating the linear regression with $$y = mx + b$$

where y is the predicted peak applied voltage, x is the desired peak current, $$m = \frac{N \sum_{i=1}^{N} (x_i y_i) - \sum_{i=1}^{N} x_i \sum_{i=1}^{N} y_i}{N \sum_{i=1}^{N} x_i^2 - (\sum_{i=1}^{N} x_i)^2},$$

$$b = \frac{\sum_{i=1}^{N} y_i - m \sum_{i=1}^{N} x_i}{N},$$

i is an index of the values from the buffer, and

N is a number of predicted peak applied voltages in the buffer.

18. The method of claim 17, wherein N is no less than five.

19. The method of claim 11, wherein the current controller is a PI current controller.

20. The method of claim 11, further comprising adjusting operation of the motor to prevent further soft crashing of the piston.

21. The method of claim 11, further comprising:

calculating a position of the piston of the linear compressor when the piston is soft crashing against the discharge valve of the linear compressor; and calibrating a clearance value between the piston of the linear compressor and the discharge valve of the linear compressor based upon an error between the calculated position of the piston of the linear compressor when the piston is soft crashing against the discharge valve of the linear compressor and an estimated clearance value.

22. A method for detecting head crashing in a linear compressor, comprising:

step for filtering a peak applied voltage to provide a rolling average of the peak applied voltage;

step for sampling the rolling average of the peak applied voltage and the desired peak current each time that the desired peak current is adjusted in order to fill a buffer with a plurality of values for the rolling average of the peak applied voltage and for the desired peak current;

step for calculating a linear regression for a predicted peak applied voltage as a function of the desired peak current with the plurality of values from the buffer;

step for calculating the predicted peak voltage for the motor of the linear compressor with the linear regression; and step for establishing that a piston of the linear compressor is soft crashing against a discharge valve of the linear compressor.

23. The method of claim 22, further comprising:

step for calculating a position of the piston of the linear compressor when the piston is soft crashing against the discharge valve of the linear compressor; and step for calibrating a clearance value between the piston of the linear compressor and the discharge valve of the linear compressor based upon an error between the calculated position of the piston of the linear compressor when the piston is soft crashing against the discharge valve of the linear compressor and an estimated clearance value.

24. A method for detecting head crashing in a linear compressor, comprising:

operating the motor of the linear compressor with a current controller that drives the motor to a desired peak current;

incrementally adjusting the desired peak current;

each time that the desired peak current is adjusted, sampling the peak applied voltage and the desired peak current from immediately prior to adjusting the desired peak current in order to fill a buffer with a plurality of values for peak applied voltage and for the desired peak current;

calculating a predicted peak applied voltage based upon a current value for the desired peak current from the current controller and the plurality of values from the buffer;

comparing the predicted peak voltage with a current value for the peak applied voltage;

establishing that a piston of the linear compressor is soft crashing against a discharge valve of the linear compressor when the current value for the peak applied voltage is greater than the predicted peak voltage by more than a threshold value; and adjusting operation of the motor to prevent further soft crashing of the piston.

25. The method of claim 24, further comprising:

calculating a position of the piston of the linear compressor when the piston is soft crashing against the discharge valve of the linear compressor; and calibrating a clearance value between the piston of the linear compressor and the discharge valve of the linear compressor based upon an error between the calculated position of the piston of the linear compressor when the piston is soft crashing against the discharge valve of the linear compressor and an estimated clearance value.

* * * * *